(12) United States Patent
Tong et al.

(10) Patent No.: US 8,059,422 B2
(45) Date of Patent: Nov. 15, 2011

(54) THERMALLY ENHANCED PACKAGE STRUCTURE

(75) Inventors: Ho-Ming Tong, Taipei (TW); Shin-Hua Chao, Kaohsiung (TW); Ming-Chiang Lee, Kaohsiung (TW); Tai-Yuan Huang, Kaohsiung County (TW); Chao-Yuan Liu, Kaohsiung (TW); Yung-Cheng Huang, Kaohsiung (TW); Teck-Chong Lee, Kaohsiung (TW); Jen-Chieh Kao, Kaohsiung (TW); Jau-Shoung Chen, Hsinchu County (TW)

(73) Assignees: Advanced Semiconductor Engineering, Inc., Kaohsiung (TW); ASE Electronics Inc., Kaohsiung (TW)

( * ) Notice: Subject to any disclaimer, the term of this patent is extended or adjusted under 35 U.S.C. 154(b) by 648 days.

(21) Appl. No.: 12/183,398

(22) Filed: Jul. 31, 2008

(65) Prior Publication Data

US 2009/0075027 A1    Mar. 19, 2009

(30) Foreign Application Priority Data

Sep. 18, 2007   (TW) ................................ 96134762 A

(51) Int. Cl.
*H05K 1/18* (2006.01)

(52) U.S. Cl. ........ 361/761; 361/768; 361/688; 361/707; 361/711; 361/717

(58) Field of Classification Search .......... 361/790–795, 361/761, 762, 764, 768, 748–751, 688, 704–707, 361/709–720, 760, 767, 679.01
See application file for complete search history.

(56) References Cited

U.S. PATENT DOCUMENTS

| | | | |
|---|---|---|---|
| 6,400,573 B1 * | 6/2002 | Mowatt et al. | 361/719 |
| 7,548,430 B1 * | 6/2009 | Huemoeller et al. | 361/760 |
| 2001/0027605 A1 * | 10/2001 | Nabemoto et al. | 29/830 |
| 2001/0030059 A1 * | 10/2001 | Sugaya et al. | 174/256 |
| 2005/0045369 A1 * | 3/2005 | Ishimaru et al. | 174/250 |
| 2006/0087020 A1 * | 4/2006 | Hirano et al. | 257/686 |
| 2007/0227761 A1 * | 10/2007 | Tuominen et al. | 174/252 |
| 2008/0101044 A1 * | 5/2008 | Chang | 361/761 |
| 2009/0129037 A1 * | 5/2009 | Yoshino | 361/761 |

* cited by examiner

*Primary Examiner* — Hoa C Nguyen
(74) *Attorney, Agent, or Firm* — J.C. Patents

(57) ABSTRACT

A manufacturing process for a thermally enhanced package is disclosed. First, a substrate strip including at least a substrate is provided. Next, at least a chip is disposed on an upper surface of the substrate, and the chip is electrically connected to the substrate. Then, a prepreg and a heat dissipating metal layer are provided, and the heat dissipating metal layer is disposed on a first surface of the prepreg and a second surface of the prepreg faces toward the chip. Finally, the prepreg covers the chip by laminating the prepreg and the substrate.

14 Claims, 15 Drawing Sheets

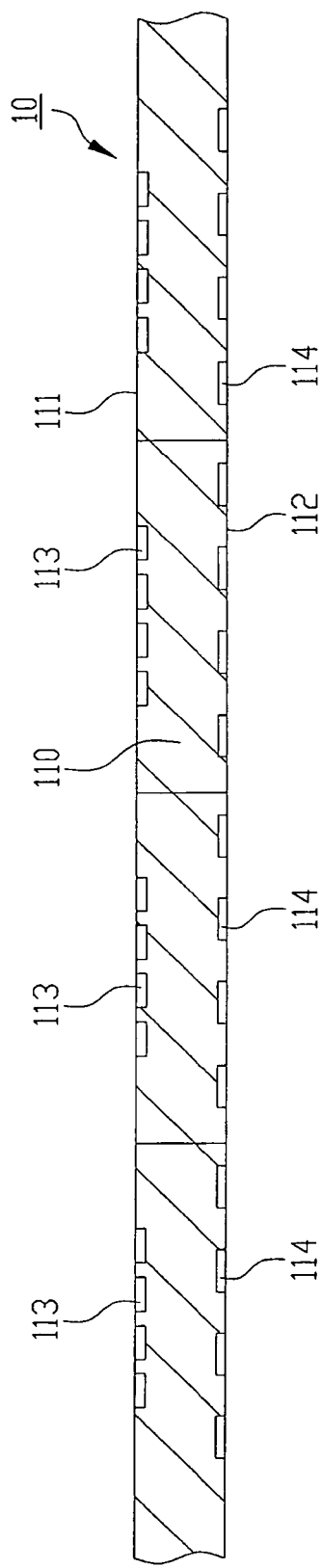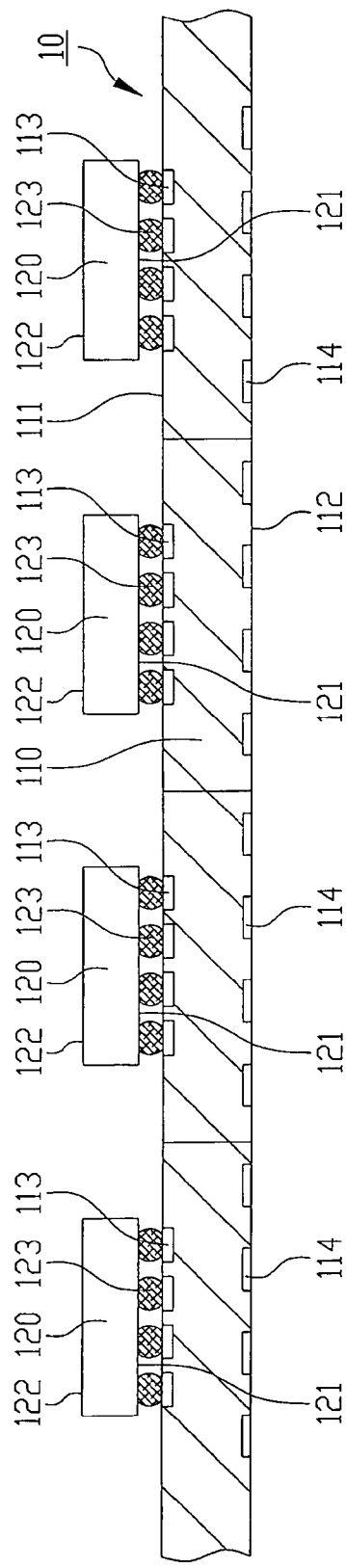
FIG. 1A
FIG. 1B

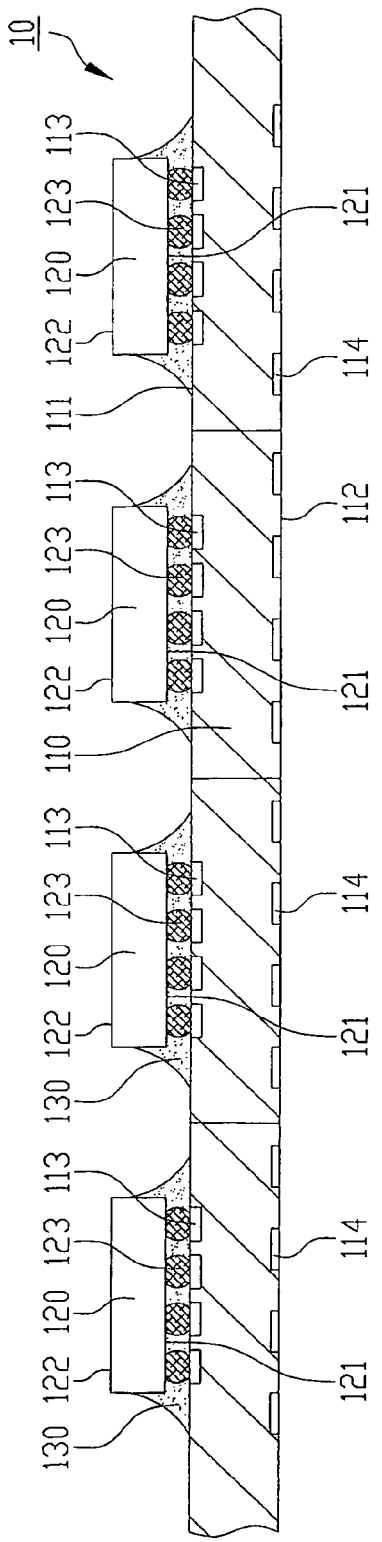
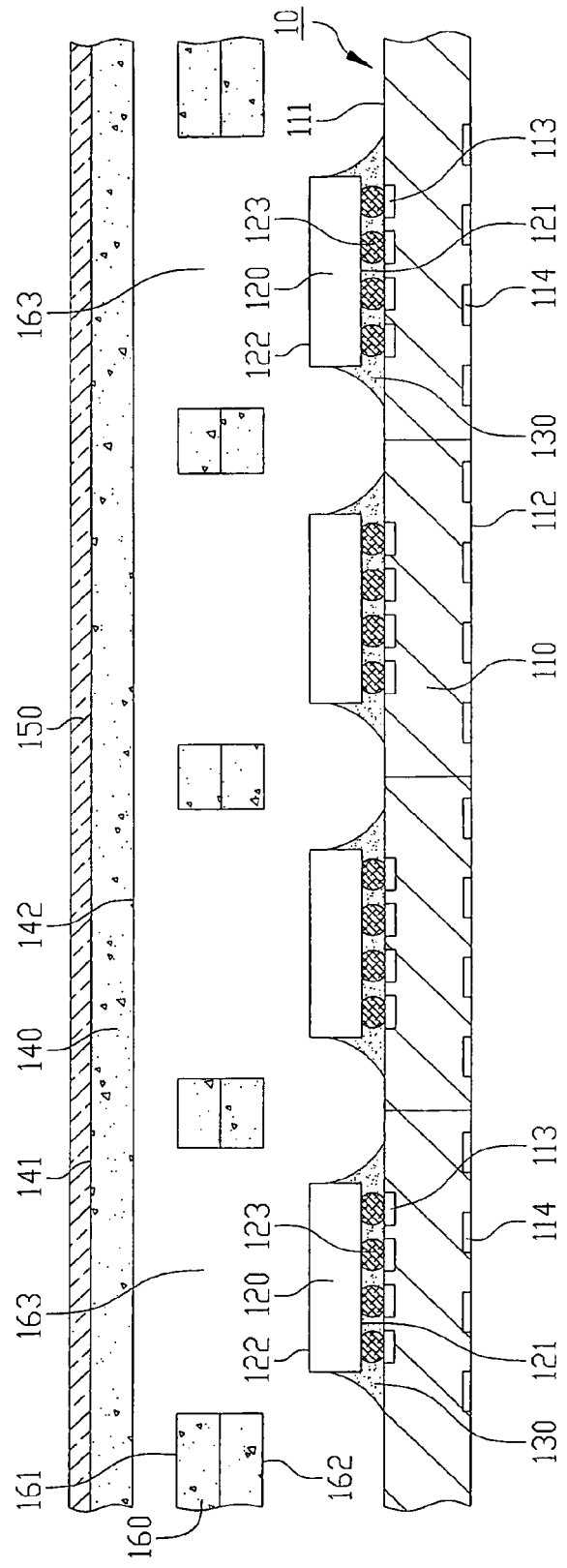
FIG. 1C
FIG. 1D

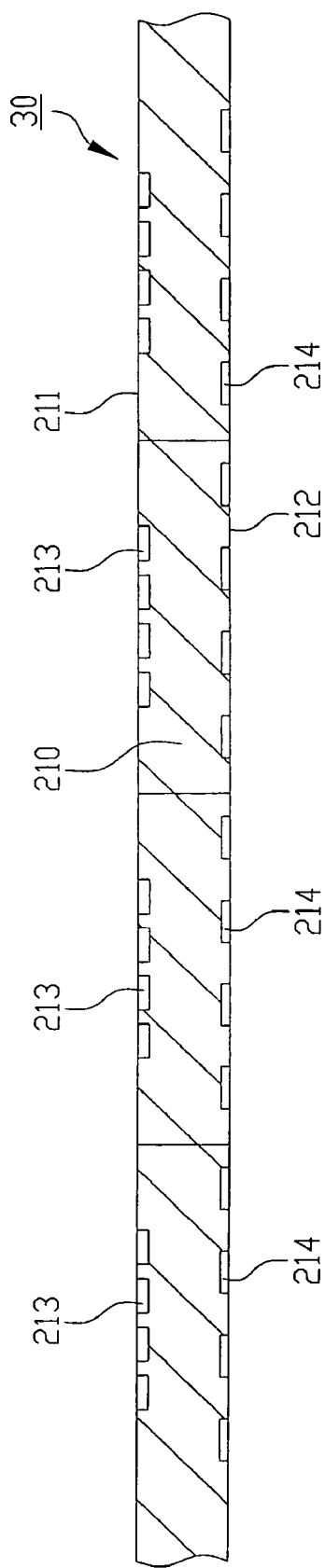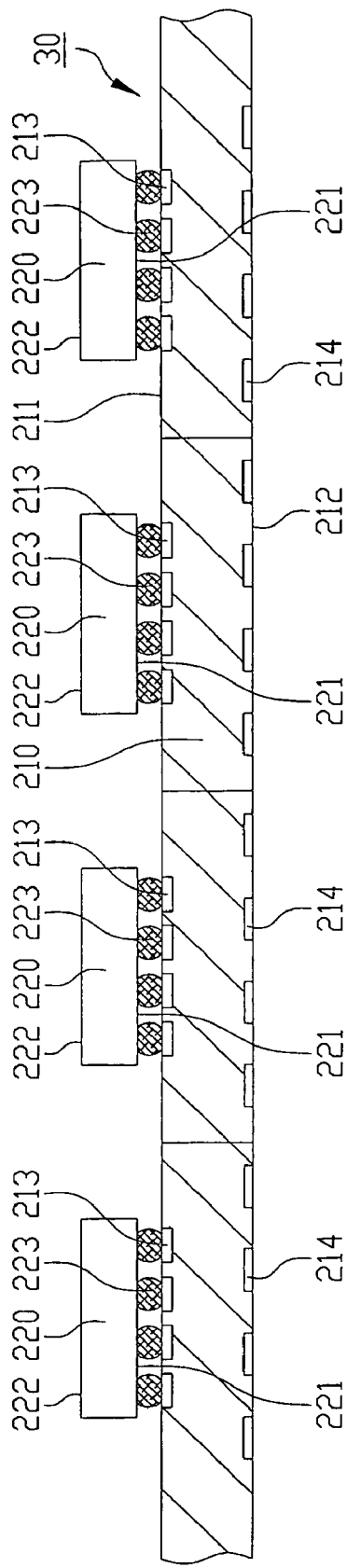

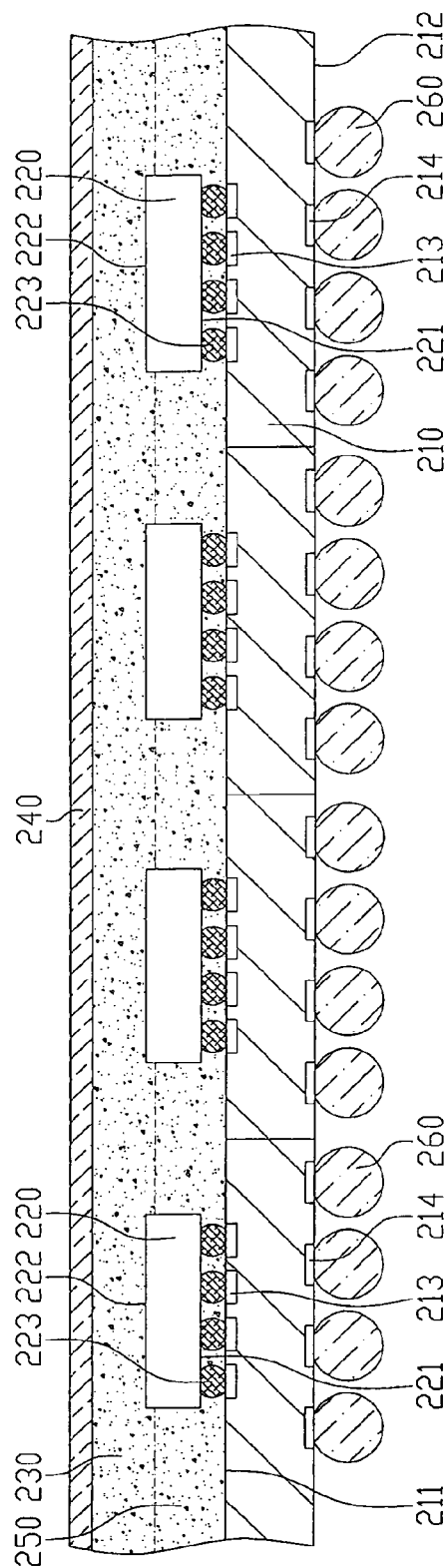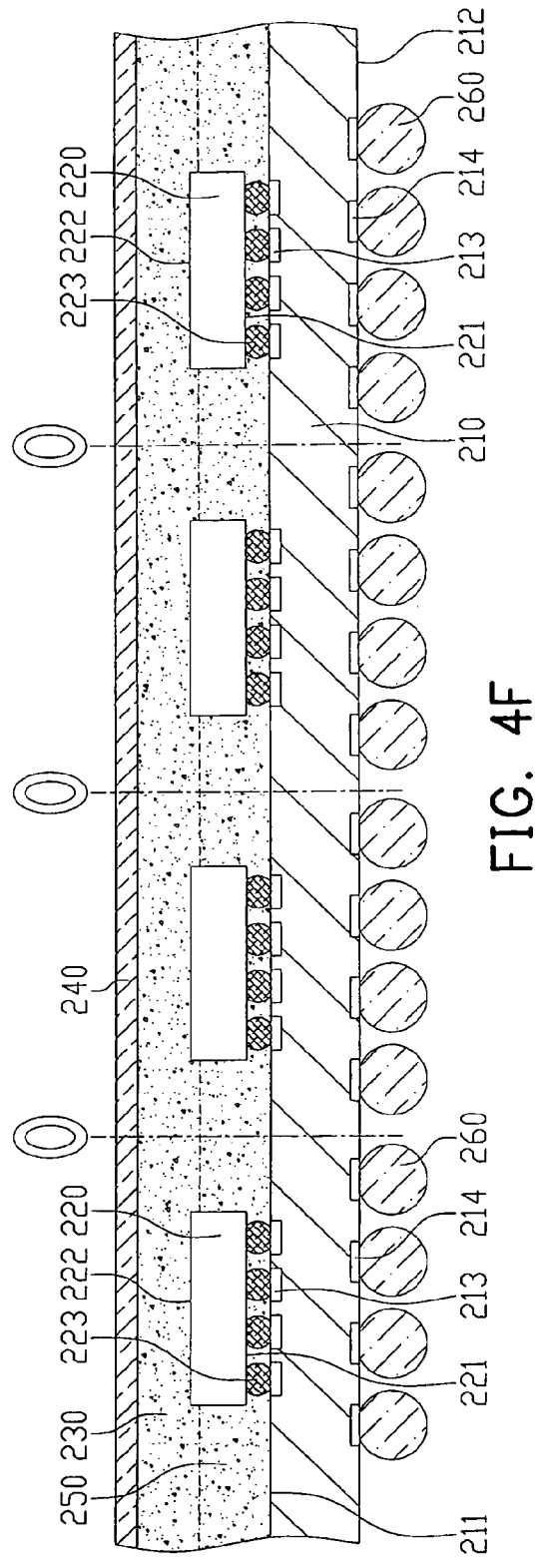

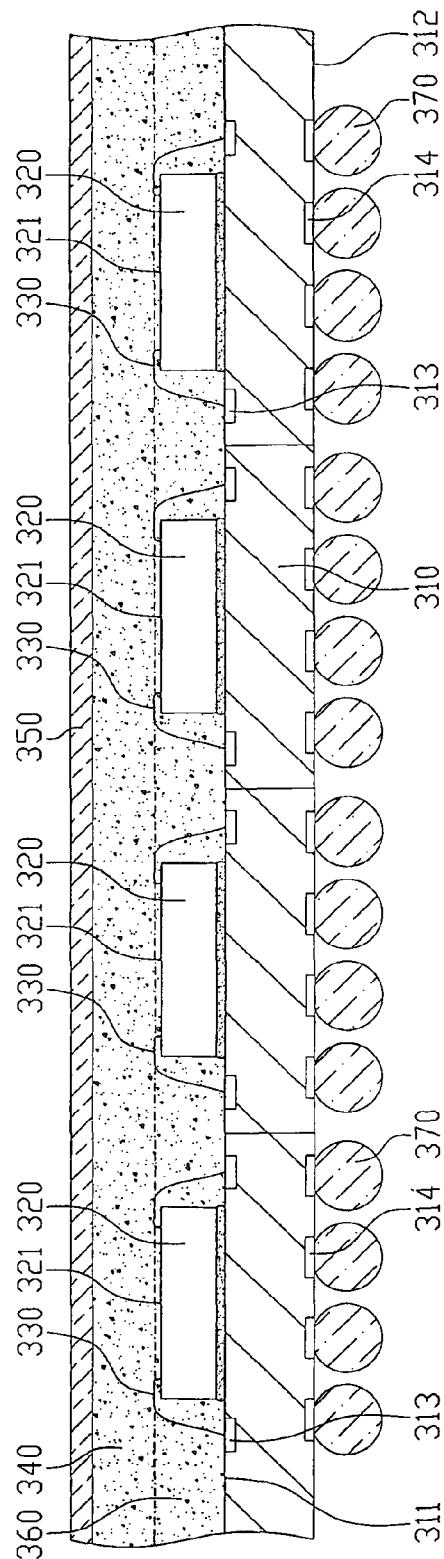
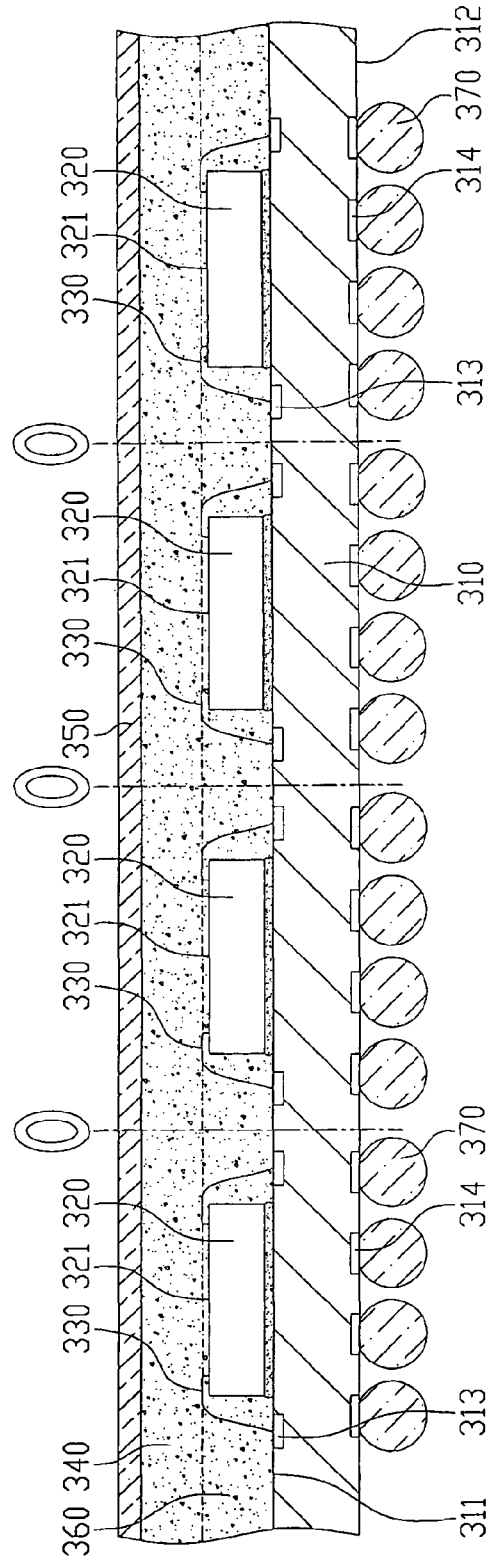
FIG. 7E
FIG. 7F

THERMALLY ENHANCED PACKAGE STRUCTURE

CROSS-REFERENCE TO RELATED APPLICATION

This application claims the priority benefit of Taiwan application serial no. 96134762, filed Sep. 18, 2007. The entirety of the above-mentioned patent application is hereby incorporated by reference herein and made a part of this specification.

BACKGROUND OF THE INVENTION

1. Field of the Invention

The present invention relates to a manufacturing process of a package, and particularly relates to a manufacturing process of a thermally enhanced package.

2. Description of Related Art

In a conventional package process, it is required to perform a molding process to seal and protect a chip. However, such a process not only increases the costs for equipment and molds but also involves complicated technology. The high costs and complicated technology do not certainly guarantee the quality of the products. Hence, they are considered uneconomic.

SUMMARY OF THE INVENTION

The present invention is directed to a manufacturing process of a thermally enhanced package. First, a substrate strip including at least a substrate is provided; next, a chip is disposed on the substrate, and a plurality of bumps of the chip is electrically connected to a plurality of bonding pads of the substrate; then, a first prepreg and a heat dissipating metal layer are provided, wherein the first prepreg comprises a first surface, on which the heat dissipating metal layer is disposed, and a second surface, which faces toward a back surface of the chip; and finally, the first prepreg covers the chip by laminating the first prepreg and the substrate. According to the present invention, the conventional process of forming a package structure through encapsulating a molding compound is replaced by a process of laminating the first prepreg. Hence, the stability is increased and the costs required are reduced.

The present invention is also directed to a manufacturing process of a substrate, further comprising: laminating a second prepreg and the substrate, wherein the second prepreg is disposed between the first prepreg and the substrate, and has at least an opening aligned with the chip; and laminating the first prepreg, the second prepreg, and the substrate to cover the chip and reduce the occurrence of bubbles.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A through 1G are schematic cross-sectional views illustrating a manufacturing process of a thermally enhanced package according to a first embodiment of the present invention.

FIGS. 4A through 4F are schematic cross-sectional views illustrating another manufacturing process of a thermally enhanced package according to a third embodiment of the present invention.

FIGS. 7A through 7F are schematic cross-sectional views illustrating another manufacturing process of a thermally enhanced package according to a fifth embodiment of the present invention.

DESCRIPTION OF EMBODIMENTS

Figure 1E:
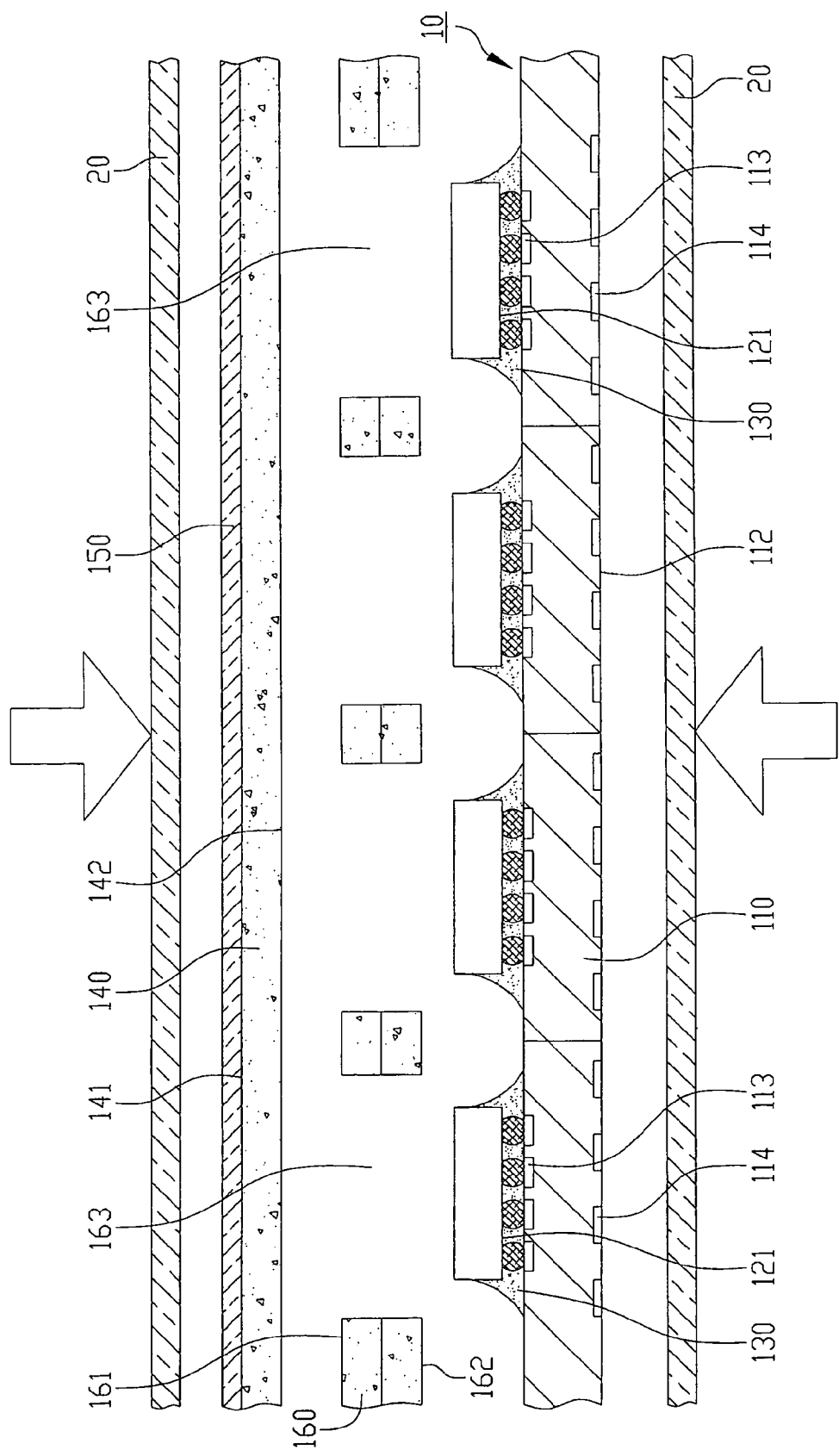
Figure 1F:
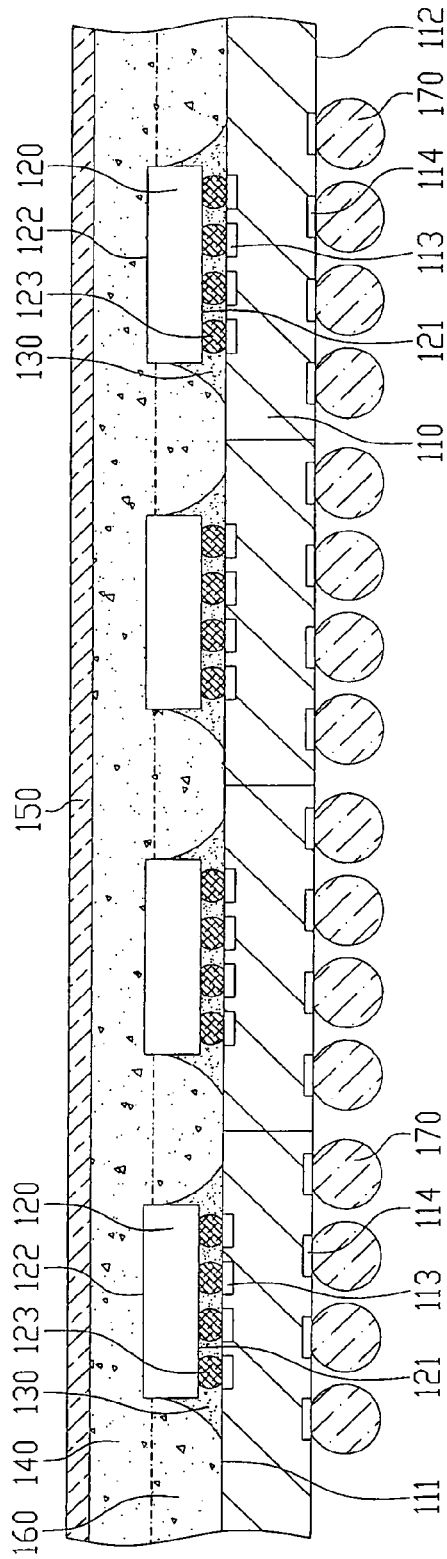
Figure 1G:
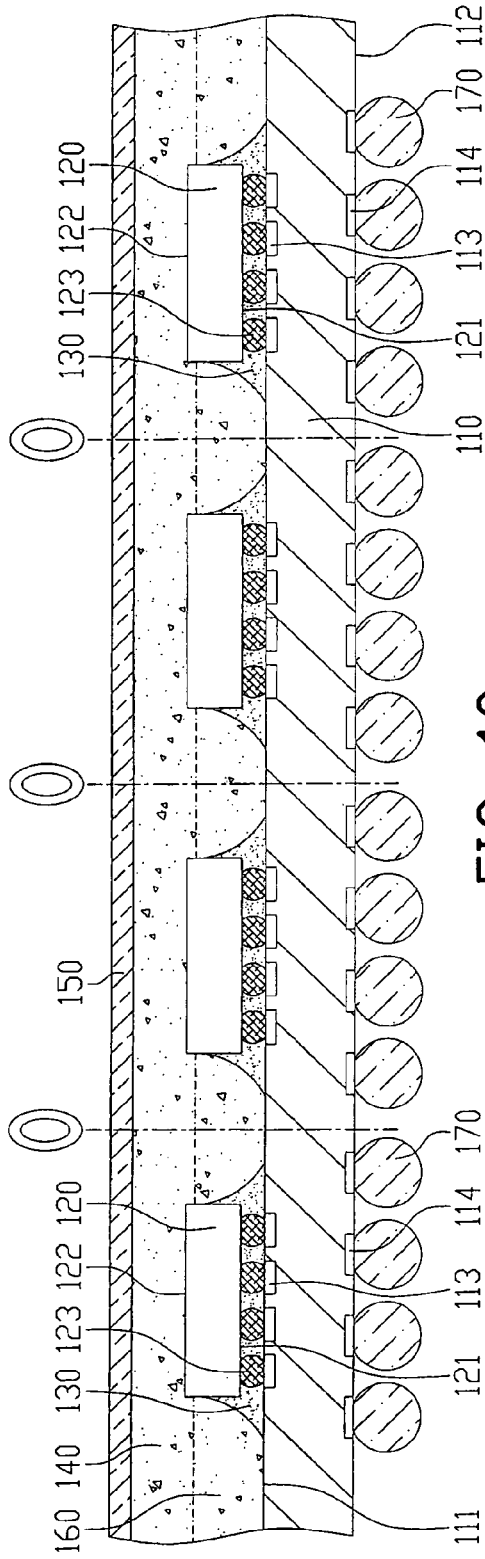

Referring to FIGS. 1A through 1G, an embodiment of the present invention discloses a manufacturing process of a thermally enhanced package. First, referring to FIG. 1A, a substrate strip 10 is provided. The substrate strip 10 comprises a plurality of substrates 110, and each of the substrates 110 comprises an upper surface 111, a lower surface 112, a plurality of first bonding pads 113, and a plurality of second bonding pads 114. The first bonding pads 113 are formed on the upper surface 111, and the second bonding pads 114 are formed on the lower surface 112. Next, referring to FIG. 1B, a plurality of chips 120 is disposed on the upper surfaces 111 of the substrates 110. Each of the chips 120 comprises an active surface 121, a back surface 122, and a plurality of bumps 123. The bumps 123 of the chips 120 are electrically connected to the first bonding pads 113 of the substrates 110. Then, referring to FIG. 1C, an underfill 130 is formed on the upper surfaces 111 to cover the active surfaces 121 and the bumps 123, and to expose the back surfaces 122 of the chips 120. The underfill 130 is adapted for enhancing the bonding strength between the chips 120 and the substrates 110. Thereafter, referring to FIG. 1D, a first prepreg 140 and a heat dissipating metal layer 150 are provided. The first prepreg 140 comprises a first surface 141 and a second surface 142. The second surface 142 faces toward the back surfaces 122 of the chips 120. The heat dissipating metal layer 150 is disposed on the first surface 141 of the first prepreg 140, and is formed by copper or a copper layer undergoing a surface treatment. In this process, a second prepreg 160 is further provided. The second prepreg 160 may be formed by stacking a plurality of prepregs in advance. Alternatively, the second prepreg 160 and the first prepreg 140 may be formed in one piece or combined as one piece in another embodiment. The second prepreg 160 is disposed between the first prepreg 140 and the substrates 110, and the second prepreg 160 comprises a third surface 161, a fourth surface 162, and a plurality of openings 163. The third surface 161 faces toward the second surface 142 of the first prepreg 140, and the openings 163 are formed on the fourth surface 162. Preferably, the openings 163 pass through the third surface 161 and the fourth surface 162, and the openings 163 are aligned with the chips 120. In this embodiment, the first prepreg 140 and the second prepreg 160 have the characteristics of B-stage, and are in semisolid form so that the first prepreg 140 and the second prepreg 160 can have fluidity. Following that, referring to FIG. 1E, a damper 20 is used to simultaneously laminate the semisolid first prepreg 140, the heat dissipating metal layer 150, the semisolid second prepreg 160, and the substrates 110. Further, a heating process may be performed to cure the first prepreg 140 and the second prepreg 160 during the laminating process. Next, referring to FIG. 1F, after the laminating process, the first prepreg 140 covers the chips 120. The second prepreg 160 is attached to the upper surfaces 111 of the substrates 110, and covers the underfill 130. Then, a plurality of solder balls 170 is disposed on the lower surfaces 112 of the substrates 110, and is connected to the second bonding pads 114. Finally, referring to FIG. 1G, the substrate strip 10 is cut to form a plurality of individual package structures 100. Because the first prepreg 140 and the second prepreg 160 comprise glass fiber or a filler, the structural strength and reliability of the substrates 110 are enhanced.

Figure 2:
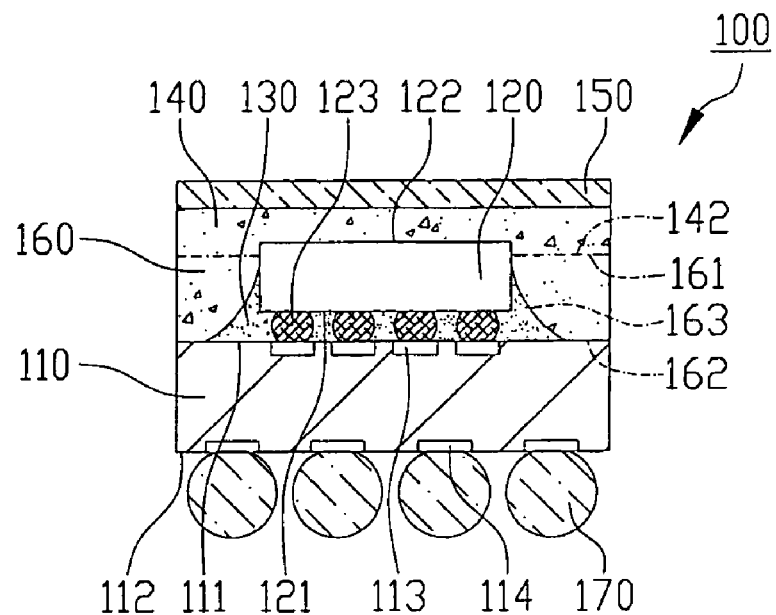
FIG. 2 is a schematic cross-sectional view illustrating the thermally enhanced package structure according to a first embodiment of the present invention.

Referring to FIG. 2, an embodiment of the present invention discloses a thermally enhanced package structure 100, which comprises a substrate 110, a chip 120, a first prepreg 140, and a heat dissipating metal layer 150. The substrate 110 comprises an upper surface 111, a lower surface 112, a plurality of first bonding pads 113, and a plurality of second bonding pads 114. The first bonding pads 113 are formed on the upper surface 111, and the second bonding pads 114 are formed on the lower surface 112. The chip 120 is disposed on the upper surface 111 of the substrate 110. The chip 120 comprises an active surface 121, a back surface 122, and a plurality of bumps 123. The bumps 123 of the chip 120 are electrically connected to the first bonding pads 113 of the substrate 110. The first prepreg 140 comprises a first surface 141 and a second surface 142. The first prepreg 140 covers the chip 120, and the heat dissipating metal layer 150 is disposed on the first surface 141 of the first prepreg 140 to increase heat dissipation. Preferably, the thermally enhanced package structure 100 further comprises an underfill 130, a second prepreg 160, and a plurality of solder balls 170. The underfill 130 is formed on the upper surface 111 to cover the active surface 121 and the bumps 123. The second prepreg 160 comprises a third surface 161, a fourth surface 162, and an opening 163 formed on the fourth surface 162. In this embodiment, the opening 163 passes through the third surface 161 and the fourth surface 162. The second prepreg 160 is disposed between the first prepreg 140 and the substrate 110. The chip 120 is disposed in the opening 163, and the third surface 161 of the second prepreg 160 is connected to the second surface 142 of the first prepreg 140, so as to completely cover the chip 120. In another embodiment, the second prepreg 160 and the first prepreg 140 are formed in one piece or combined as one piece in advance. In this embodiment, the second prepreg 160 is compressed and attached to the upper surface 111 of the substrate 110, and covers the underfill 130. The solder balls 170 are disposed on the lower surface 112 of the substrate 110, and connected to the second bonding pads 114 for external connection with a circuit board (not shown).

Figure 3:
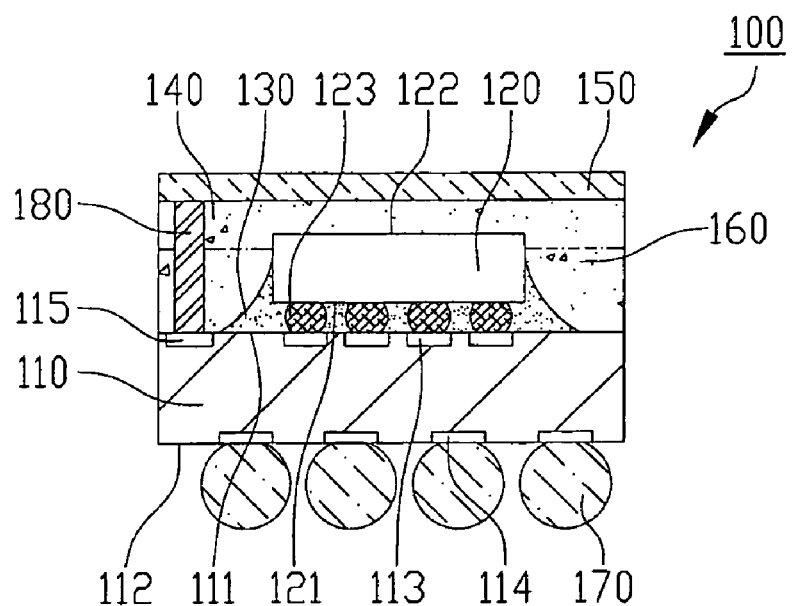
FIG. 3 is a schematic cross-sectional view illustrating another thermally enhanced package structure according to a second embodiment of the present invention.
Figure 4C:
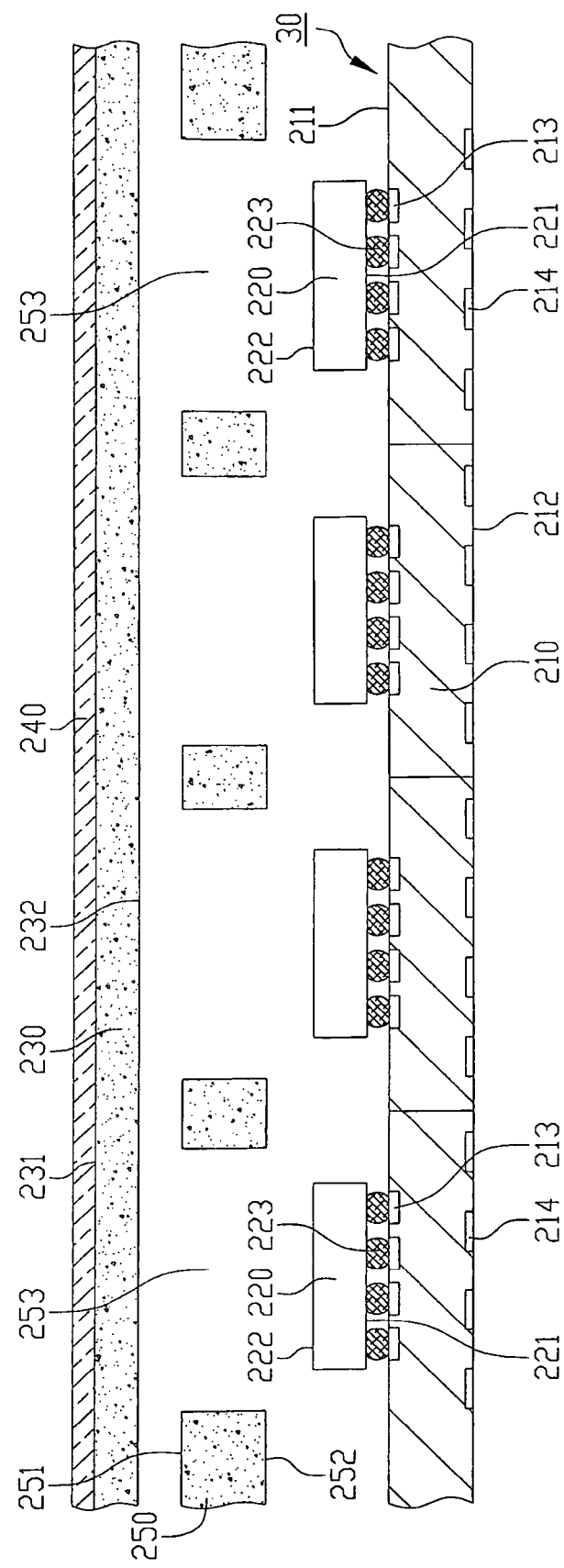
Figure 4D:
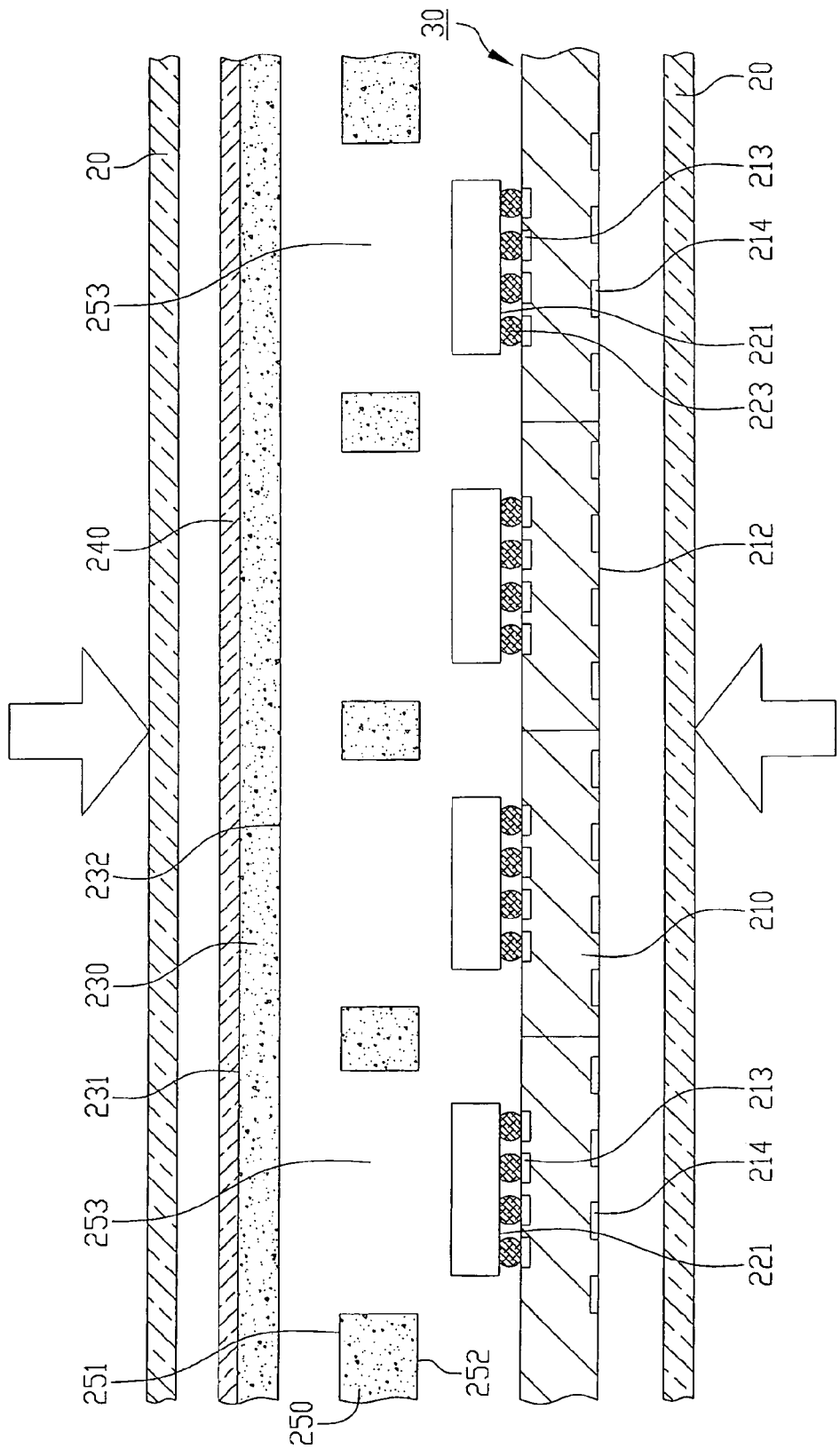

In addition, referring to FIG. 3, the thermally enhanced package structure 100 according to another embodiment further comprises at least a plated through hole 180 formed in the first prepreg 140 and the second prepreg 160. The substrate 110 further comprises a plurality of third bonding pads 115 formed outside the first bonding pads 113 and connected with the heat dissipating metal layer 150 via the plated through hole 180. Preferably, when the heat dissipating metal layer 150 is a patterned circuit layer, another package structure (not shown) may be disposed above the heat dissipating metal layer 150, and electrically conducted with the thermally enhanced package structure 100 via the plated through hole 180.

Referring to FIGS. 4A through 4F, another embodiment of the present invention discloses another manufacturing process of a thermally enhanced package. First, referring to FIG. 4A, a substrate strip 30 is provided. The substrate strip 30 comprises a plurality of substrates 210, and each of the substrates 210 comprises an upper surface 211, a lower surface 212, a plurality of first bonding pads 213 formed on the upper surface 211, and a plurality of second bonding pads 214 formed on the lower surface 212. Next, referring to FIG. 4B, a plurality of chips 220 is disposed on the upper surfaces 211 of the substrates 210. Each of the chips 220 comprises an active surface 221, a back surface 222, and a plurality of bumps 223. The bumps 223 of the chips 220 are electrically connected to the first bonding pads 213 of the substrates 210. Then, referring to FIG. 4C, a first prepreg 230 and a heat dissipating metal layer 240 are provided. The first prepreg 230 comprises a first surface 231 and a second surface 232. The second surface 232 faces toward the back surfaces 222 of the chips 220. The heat dissipating metal layer 240 is disposed on the first surface 231 of the first prepreg 230, and is formed by copper or a copper layer undergoing a surface treatment. In this process, a second prepreg 250 is further provided. The second prepreg 250 may be formed by stacking a plurality of prepregs in advance. Alternatively, the second prepreg 250 and the first prepreg 230 may be formed in one piece in another embodiment. The second prepreg 250 is disposed between the first prepreg 230 and the substrates 210, and the second prepreg 250 comprises a third surface 251, a fourth surface 252, and a plurality of openings 253. The third surface 251 faces toward the second surface 232 of the first prepreg 230, and the openings 253 are formed on the fourth surface 252. Preferably, the openings 253 pass through the third surface 251 and the fourth surface 252, and the openings 253 are aligned with the chips 220. In this embodiment, the first prepreg 230 and the second prepreg 250 have the characteristics of B-stage, and are in semisolid form so that the first prepreg 230 and the second prepreg 250 can have fluidity. Following that, referring to FIG. 4D, a damper 20 is used to simultaneously laminate the semisolid first prepreg 230, the heat dissipating metal layer 240, the semisolid second prepreg 250, and the substrates 210. Further, a heating process and a vacuum process may be performed to cure the first prepreg 230 and the second prepreg 250 during the laminating process. Thereby, the first prepreg 230 and the second prepreg 250 can be easily filled between the chips 220 and the substrates 210. Next, referring to FIG. 4E, after the laminating process, the first prepreg 230 covers the chips 220. The second prepreg 250 is compressed and attached to the upper surfaces 211 of the substrates 210, and covers the bumps 223. Then, a plurality of solder balls 260 is disposed on the lower surfaces 212 of the substrates 210, and is connected to the second bonding pads 214. Finally, referring to FIG. 4F, the substrate strip 30 is cut to form a plurality of individual package structures 200. Because the first prepreg 230 and the second prepreg 250 comprise glass fiber or a filler, the structural strength and reliability of the substrates 210 are enhanced.

Figure 5:
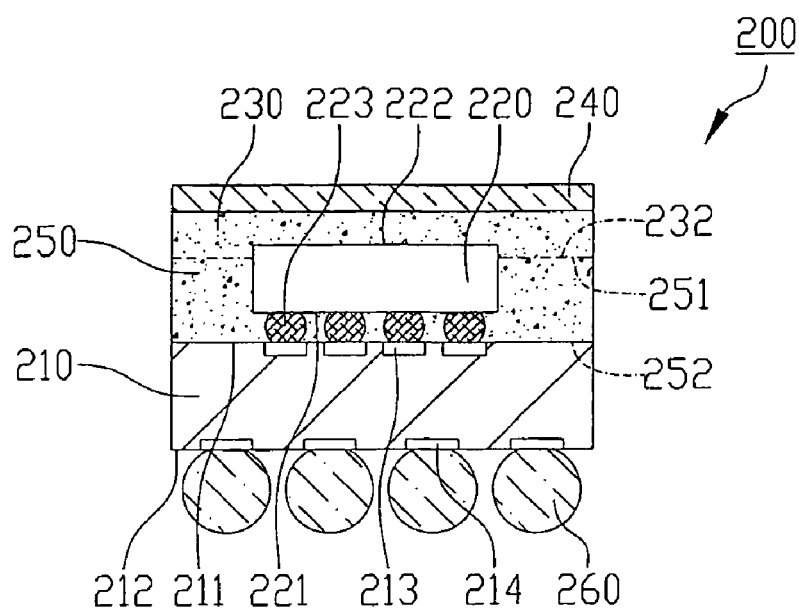
FIG. 5 is a schematic cross-sectional view illustrating the thermally enhanced package structure according to a third embodiment of the present invention.

Referring to FIG. 5, another embodiment of the present invention discloses another thermally enhanced package structure 200, which comprises a substrate 210, a chip 220, a first prepreg 230, and a heat dissipating metal layer 240. The substrate 210 comprises an upper surface 211, a lower surface 212, a plurality of first bonding pads 213 formed on the upper surface 211, and a plurality of second bonding pads 214 formed on the lower surface 212. The chip 220 is disposed on the upper surface 211 of the substrate 210. The chip 220 comprises an active surface 221, a back surface 222, and a plurality of bumps 223. The bumps 223 of the chip 220 are electrically connected to the first bonding pads 213 of the substrate 210. The first prepreg 230 comprises a first surface 231 and a second surface 232. The first prepreg 230 covers the chip 220, and the heat dissipating metal layer 240 is disposed on the first surface 231 of the first prepreg 230 to increase heat dissipation. Preferably, the thermally enhanced package structure 200 further comprises a second prepreg 250 and a plurality of solder balls 260. The second prepreg 250 comprises a third surface 251, a fourth surface 252, and an opening 253 formed on the fourth surface 252. In this embodiment, the opening 253 passes through the third surface 251 and the fourth surface 252. The second prepreg 250 is disposed between the first prepreg 230 and the substrate 210. The chip 220 is disposed in the opening 253, and the third surface 251 of the second prepreg 250 is connected to the second surface 232 of the first prepreg 230, so as to completely cover the chip 220 and the bumps 223. In another embodiment, the second prepreg 250 and the first prepreg 230 are formed in one piece or combined as one piece in advance. In this embodiment, the second prepreg 250 is compressed and attached to the upper surface 211 of the substrate 210. The solder balls 260 are disposed on the lower surface 212 of the substrate 210, and connected to the second bonding pads 214 for external connection with a circuit board (not shown).

Figure 6:
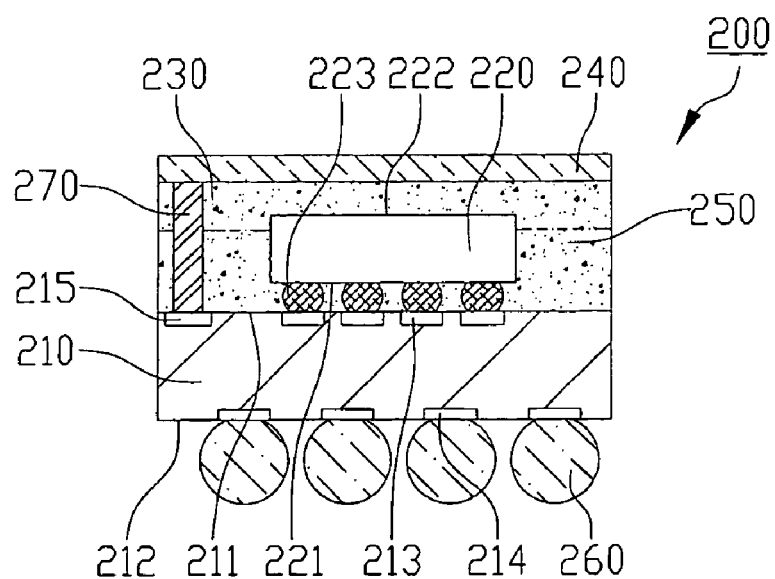
FIG. 6 is a schematic cross-sectional view illustrating another thermally enhanced package structure according to a fourth embodiment of the present invention.
Figure 7A:
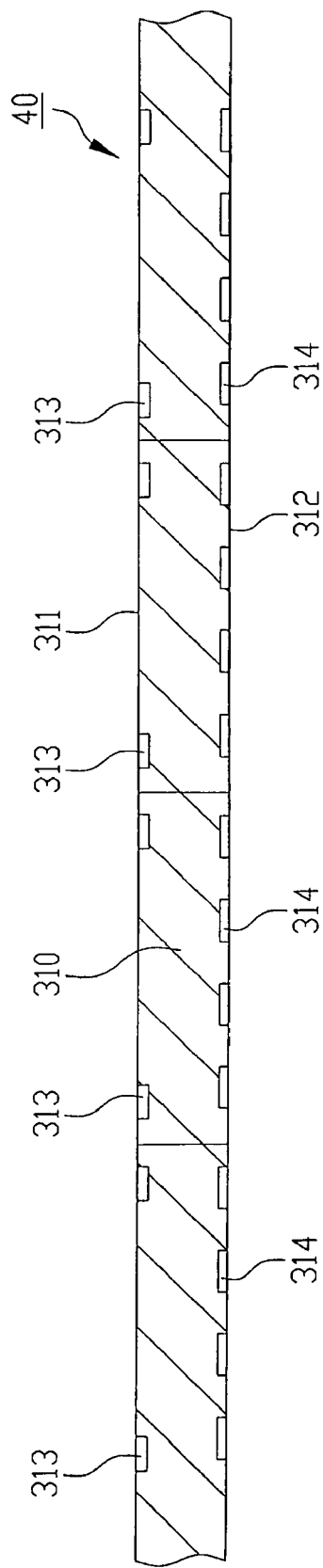
Figure 7B:
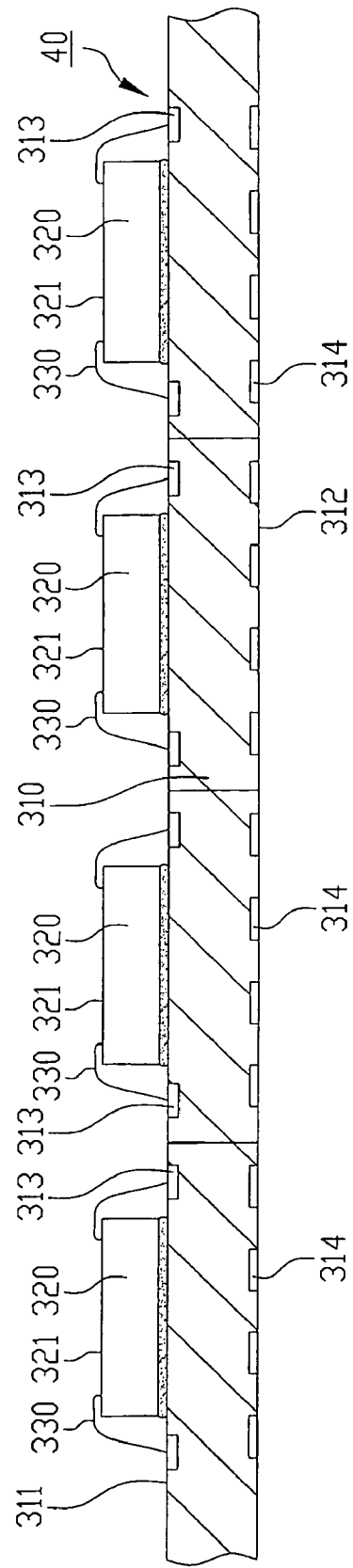
Figure 7C:
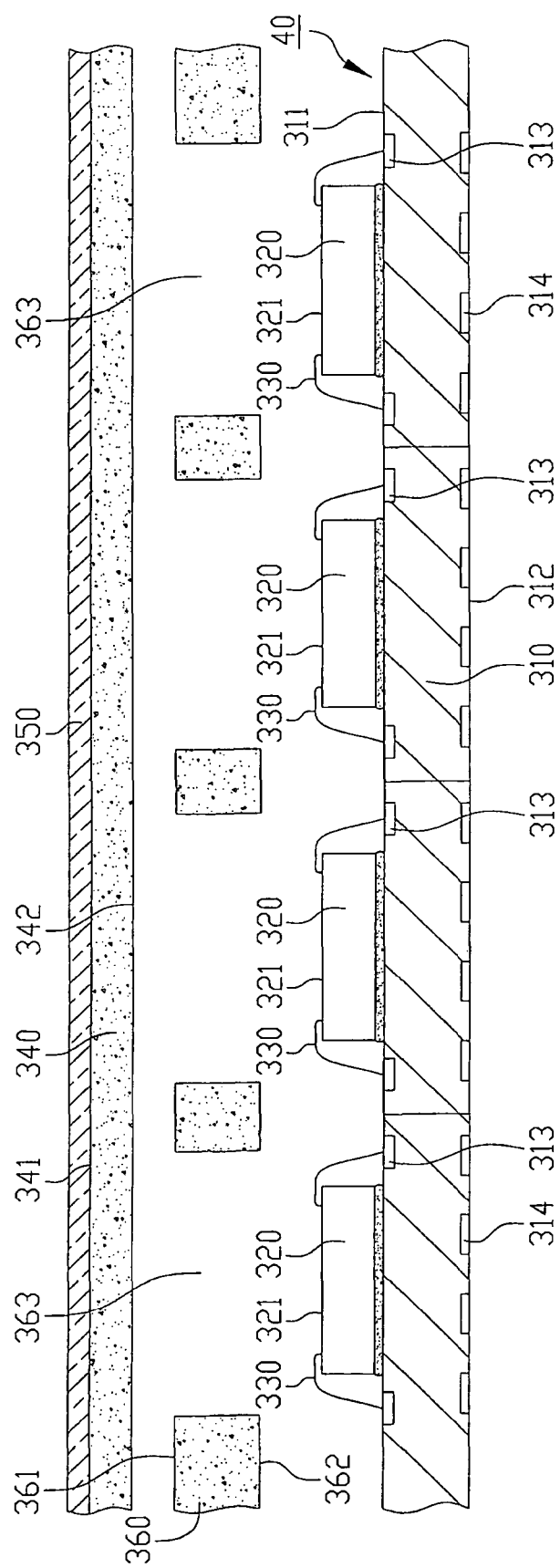
Figure 7D:
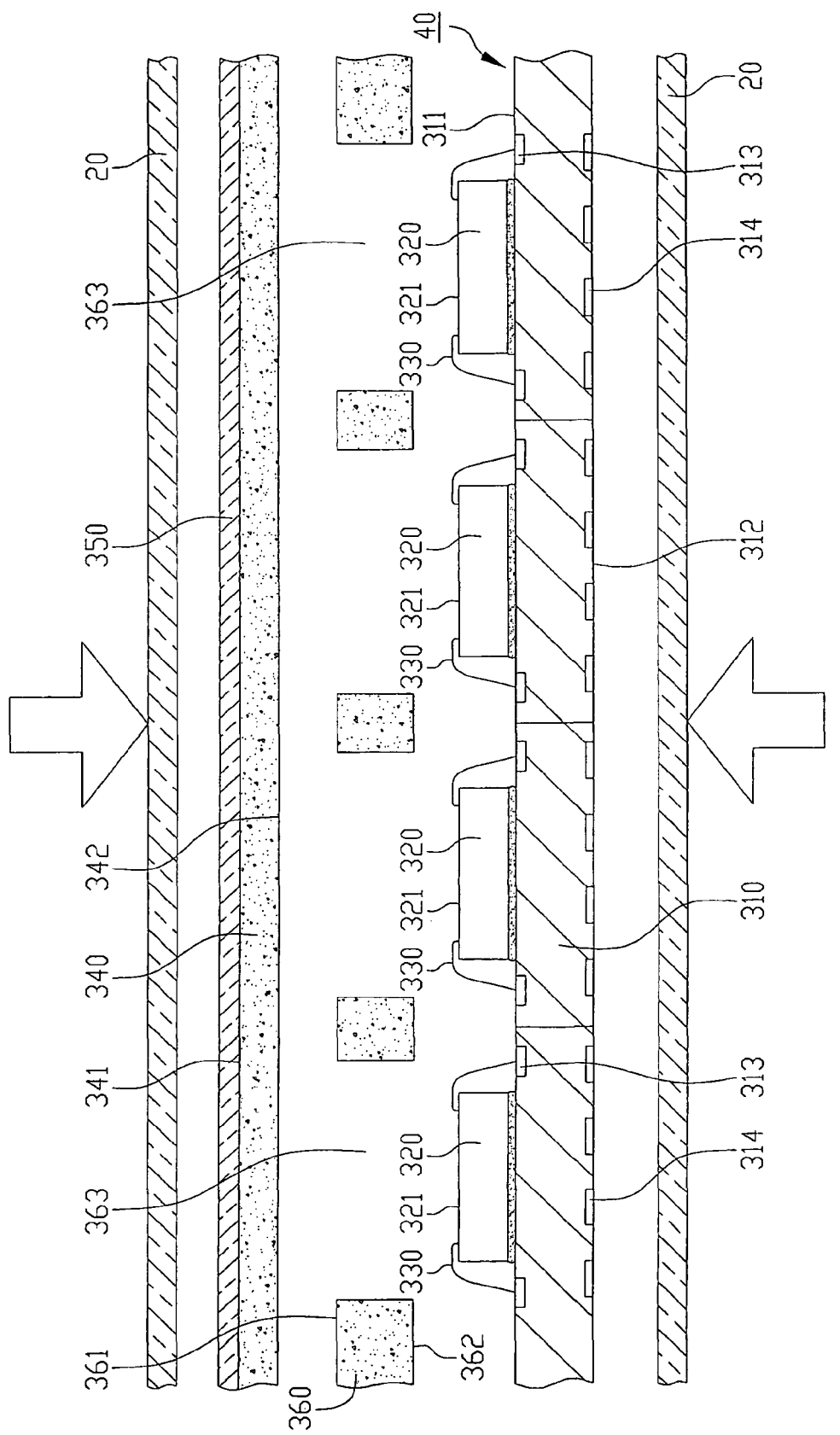

In addition, referring to FIG. 6, the thermally enhanced package structure 200 according to another embodiment further comprises at least a plated through hole 270 formed in the first prepreg 230 and the second prepreg 250. The substrate 210 further comprises a plurality of third bonding pads 215 formed outside the first bonding pads 213 and connected with the heat dissipating metal layer 240 via the plated through hole 270. Preferably, when the heat dissipating metal layer 240 is a patterned circuit layer, another package structure (not shown) may be disposed above the heat dissipating metal layer 240, and electrically conducted with the thermally enhanced package structure 200 via the plated through hole 270.

Referring to FIGS. 7A through 7F, another embodiment of the present invention further discloses another manufacturing process of a thermally enhanced package. First, referring to FIG. 7A, a substrate strip 40 is provided. The substrate strip 40 comprises a plurality of substrates 310, and each of the substrates 310 comprises an upper surface 311, a lower surface 312, a plurality of first bonding pads 313 formed on the upper surface 311, and a plurality of second bonding pads 314 formed on the lower surface 312. Next, referring to FIG. 7B, a plurality of chips 320 is disposed on the upper surfaces 311 of the substrates 310, and at least a wire 330 is formed to electrically connect the chips 320 and the substrates 310. In this embodiment, the wire 330 is bonded to the chips 320 and the first bonding pads 313 of the substrates 310 with ultra low loop, and loop of the wire 330 corresponds to the edges of the chips 320. Then, referring to FIG. 7C, a first prepreg 340 and a heat dissipating metal layer 350 are provided. The first prepreg 340 comprises a first surface 341 and a second surface 342. The second surface 342 faces toward a plurality of active surfaces 321 of the chips 320. The heat dissipating metal layer 350 is disposed on the first surface 341 of the first prepreg 340, and is formed by copper or a copper layer undergoing a surface treatment. In this process, a second prepreg 360, which comprises a third surface 361, a fourth surface 362, and a plurality of openings 363, is further provided. The second prepreg 360 may be formed by stacking a plurality of prepregs in advance. Alternatively, the second prepreg 360 and the first prepreg 340 may be formed in one piece. The second prepreg 360 is disposed between the first prepreg 340 and the substrates 310, and the third surface 361 faces toward the second surface 342 of the first prepreg 340. The openings 363 are formed on the fourth surface 362. Preferably, the openings 363 pass through the third surface 361 and the fourth surface 362, and the openings 363 are aligned with the chips 320. The first prepreg 340 and the second prepreg 360 have the characteristics of B-stage, and are in semisolid form so that the first prepreg 340 and the second prepreg 360 can have fluidity. Following that, referring to FIG. 7D, a damper 20 is used to simultaneously laminate the semisolid first prepreg 340, the heat dissipating metal layer 350, the semisolid second prepreg 360, and the substrates 310. Consequently, the chips 320 and the wires 330 are covered by the first prepreg 340 and the second prepreg 360, which replaces a conventional manufacturing process. Further, a heating process may be performed to cure the first prepreg 340 and the second prepreg 360 during the laminating process. Next, referring to FIG. 7E, a plurality of solder balls 370 is disposed on the lower surfaces 312 of the substrates 310, and the solder balls 370 are connected to the second bonding pads 314. Finally, referring to FIG. 7F, the substrate strip 40 is cut to form a plurality of individual package structures 300. Because the first prepreg 340 and the second prepreg 360 comprise glass fiber or a filler, the structural strength of the substrates 310 is enhanced.

Figure 8:
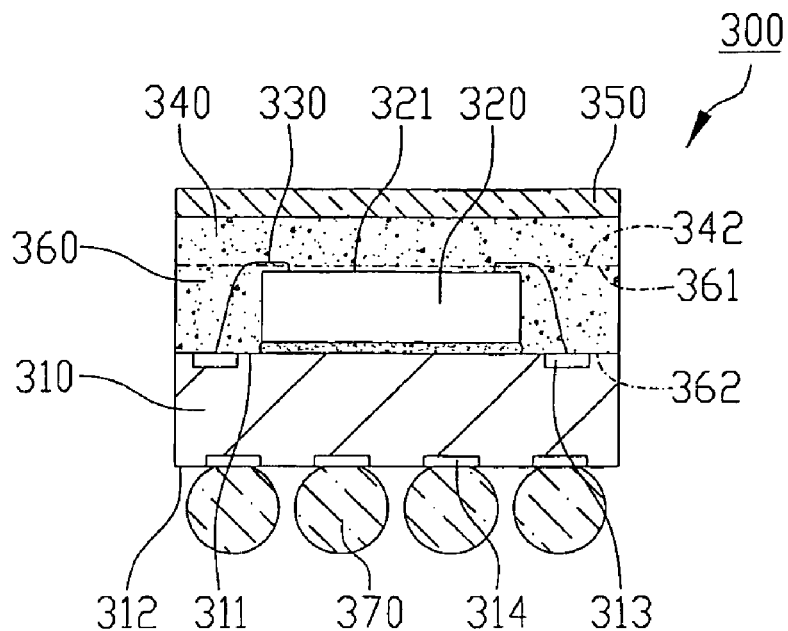
FIG. 8 is a schematic cross-sectional view illustrating the thermally enhanced package structure according to a fifth embodiment of the present invention.

Referring to FIG. 8, another embodiment of the present invention discloses another thermally enhanced package structure 300, which comprises a substrate 310, a chip 320, at least a wire 330, a first prepreg 340, and a heat dissipating metal layer 350. The substrate 310 comprises an upper surface 311, a lower surface 312, a plurality of first bonding pads 313 formed on the upper surface 311, and a plurality of second bonding pads 314 formed on the lower surface 312. The chip 320 is disposed on the upper surface 311 of the substrate 310, and is electrically connected to the first bonding pads 313 of the substrate 310 by the wire 330. The first prepreg 340 comprises a first surface 341 and a second surface 342. The first prepreg 340 covers the chip 320, and the heat dissipating metal layer 350 is disposed on the first surface 341 of the first prepreg 340 to increase heat dissipation. Preferably, the thermally enhanced package structure 300 further comprises a second prepreg 360 and a plurality of solder balls 370. The second prepreg 360 comprises a third surface 361, a fourth surface 362, and an opening 363 formed on the fourth surface 362. In this embodiment, the opening 363 passes through the third surface 361 and the fourth surface 362. The second prepreg 360 is disposed between the first prepreg 340 and the substrate 310. The chip 320 is disposed in the opening 363, and the third surface 361 of the second prepreg 360 is connected to the second surface 342 of the first prepreg 340, so as to completely cover the chip 320. In another embodiment, the second prepreg 360 and the first prepreg 340 may be formed in one piece or combined as one piece in advance. In this embodiment, the second prepreg 360 is compressed and attached to the upper surface 311 of the substrate 310. The solder balls 370 are disposed on the lower surface 312 of the substrate 310, and connected to the second bonding pads 314 for external connection with a circuit board (not shown).

Figure 9:
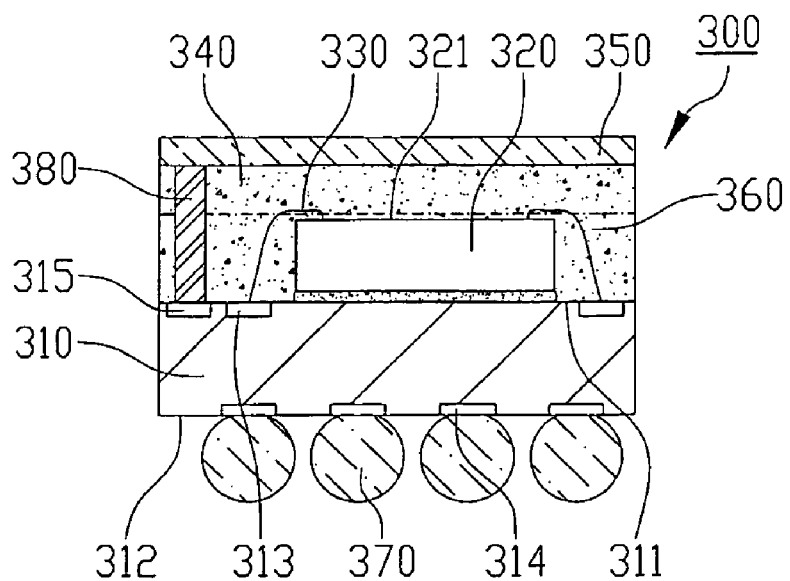
FIG. 9 is a schematic cross-sectional view illustrating another thermally enhanced package structure according to a sixth embodiment of the present invention.

In addition, referring to FIG. 9, the thermally enhanced package structure 300 according to another embodiment further comprises at least a plated through hole 380 formed in the first prepreg 340 and the second prepreg 360. The substrate 310 further comprises a plurality of third bonding pads 315 formed outside the first bonding pads 315 and connected with the heat dissipating metal layer 350 via the plated through hole 380. Preferably, when the heat dissipating metal layer 350 is a patterned circuit layer, another package structure (not shown) may be disposed above the heat dissipating metal layer 350, and electrically conducted with the thermally enhanced package structure 300 via the plated through hole 380.

It is apparent to those skilled in the art that various modifications and variations may be made to the present invention without departing from the scope or spirit of the invention. In view of the above, it is intended that the present invention covers modifications and variations provided that they fall within the scope of the following claims and their equivalents.

What is claimed is:

1. A thermally enhanced package structure, comprising:
a substrate having an upper surface and a lower surface;
a chip comprising an active surface and a back surface, and disposed on the upper surface and electrically connected to the substrate;
a first prepreg having a first surface and a second surface, wherein the second surface of the first prepreg covers the chip and contacts the back surface of the chip;
a heat dissipating metal layer disposed on the first surface of the first prepreg;
a second prepreg disposed between the first prepreg and the substrate, the second prepreg having a third surface, a fourth surface, and at least an opening formed on the fourth surface, the third surface being connected to the second surface of the first prepreg, and the chip being disposed in the opening; and
an electrically connecting component electrically connecting the active surface of the chip with the substrate, wherein the second prepreg is in contact with and covering the electrically connecting component.

2. The thermally enhanced package structure as claimed in claim 1, wherein the opening passes through the third surface and the fourth surface.

3. The thermally enhanced package structure as claimed in claim 1, wherein the substrate further comprises a plurality of first bonding pads, and the electrically connecting component comprises a plurality of bumps connected to the first bonding pads.

4. The thermally enhanced package structure as claimed in claim 3, further comprising an underfill covering the bumps of the chip.

5. The thermally enhanced package structure as claimed in claim 1, wherein the electrically connecting component comprises a plurality of bumps covered by the second prepreg.

6. The thermally enhanced package structure as claimed in claim 1, wherein the substrate further comprises a plurality of second bonding pads formed on the lower surface.

7. The thermally enhanced package structure as claimed in claim 6, further comprising a plurality of solder balls disposed on the lower surface of the substrate and connected to the second bonding pads.

8. The thermally enhanced package structure as claimed in claim 1, further comprising at least a plated through hole formed in the first prepreg and the second prepreg.

9. The thermally enhanced package structure as claimed in claim 8, wherein the substrate further comprises a plurality of third bonding pads formed outside the first bonding pads and connected to the heat dissipating metal layer via the plated through hole.

10. The thermally enhanced package structure as claimed in claim 1, wherein the electrically connecting component comprises at least a wire covered by the second prepreg.

11. The thermally enhanced package structure as claimed in claim 10, wherein loop of the wire corresponds to an edge of the chip.

12. The thermally enhanced package structure as claimed in claim 1, wherein a side surface of the substrate is aligned with a side surface of the first prepreg and a side surface of the second prepreg.

13. The thermally enhanced package structure as claimed in claim 12, wherein a side surface of the substrate is aligned with a side surface of the heat dissipating metal layer.

14. The thermally enhanced package structure as claimed in claim 1, wherein the heat dissipating metal layer is a patterned circuit layer.

* * * * *